(12) United States Patent
Zhang et al.

(10) Patent No.: US 12,112,041 B2
(45) Date of Patent: Oct. 8, 2024

(54) OUT-OF-ORDER BIT-FLIPPING DECODERS FOR NON-VOLATILE MEMORY DEVICES

(71) Applicant: SK hynix Inc., Icheon-si (KR)

(72) Inventors: Fan Zhang, Fremont, CA (US);
Meysam Asadi, San Jose, CA (US);
Haobo Wang, San Jose, CA (US)

(73) Assignee: SK HYNIX INC., Icheon-si (KR)

( * ) Notice: Subject to any disclaimer, the term of this patent is extended or adjusted under 35 U.S.C. 154(b) by 84 days.

(21) Appl. No.: 17/950,528

(22) Filed: Sep. 22, 2022

(65) Prior Publication Data

US 2024/0103727 A1    Mar. 28, 2024

(51) Int. Cl.
*G06F 3/06*        (2006.01)
*H03M 13/11*       (2006.01)

(52) U.S. Cl.
CPC .......... *G06F 3/0611* (2013.01); *G06F 3/0659* (2013.01); *G06F 3/0679* (2013.01); *H03M 13/1108* (2013.01); *H03M 13/1111* (2013.01); *H03M 13/1128* (2013.01)

(58) Field of Classification Search
CPC .... G06F 3/0611; G06F 3/0659; G06F 3/0679; H03M 13/1108; H03M 13/1111; H03M 13/1128
USPC ......................................................... 714/752
See application file for complete search history.

(56) References Cited

U.S. PATENT DOCUMENTS

| | | | |
|---|---|---|---|
| 9,015,547 B2 | 4/2015 | Wang et al. | |
| 9,184,767 B2 * | 11/2015 | Vernon | H03M 13/1117 |
| 11,265,015 B2 | 3/2022 | Zhang et al. | |
| 2014/0068368 A1 * | 3/2014 | Zhang | H03M 13/658 |
| | | | 714/752 |
| 2015/0128006 A1 * | 5/2015 | Alhussien | G06F 11/1068 |
| | | | 714/758 |
| 2020/0019460 A1 * | 1/2020 | Cadloni | G06F 3/0679 |
| 2022/0231698 A1 * | 7/2022 | Salamat | G06F 3/0673 |

OTHER PUBLICATIONS

Zhang, Fan, et al., "Fast-Convergence BF Decoder", SK Hynix Memory Solutions, Nov. 24, 2021.

* cited by examiner

*Primary Examiner* — James C Kerveros
(74) *Attorney, Agent, or Firm* — Perkins Coie LLP

(57) ABSTRACT

Devices, systems, and methods for reducing a latency of a decoder in a non-volatile memory are described. An example method includes receiving a noisy codeword that is based on a transmitted codeword generated from a low-density parity-check (LDPC) code, the LDPC code having an associated parity matrix comprising a plurality of columns of circulant matrices, performing a sorting operation that sorts the plurality of columns of circulant matrices in a descending order of a first quality metric to generate a plurality of sorted columns of circulant matrices, the first quality metric indicative of a number of errors in a corresponding column of circulant matrices, and iteratively processing the plurality of sorted columns of circulant matrices to determine a candidate version of the transmitted codeword.

20 Claims, 8 Drawing Sheets

OUT-OF-ORDER BIT-FLIPPING DECODERS FOR NON-VOLATILE MEMORY DEVICES

TECHNICAL FIELD

This patent document generally relates to non-volatile memory devices, and more specifically, to error correction in non-volatile memory devices.

BACKGROUND

Data integrity is an important feature for any data storage device and data transmission. Use of strong error-correction codes (ECCs) is recommended for various types of data storage devices including NAND flash memory devices. Solid-state drives (SSDs) use multi-level NAND flash devices for persistent storage. However, multi-level NAND flash devices can be inherently unreliable and generally need to use ECCs to allow dramatic increase in data reliability at the expense of extra storage space for ECC parity bits. There is a demand for more efficient decoding approaches that can provide data protection with reduced latency.

SUMMARY

Embodiments of the disclosed technology relate to the operation of bit-flipping (BF) decoders, which are used to decode low-density parity-check (LDPC) codes, in non-volatile memory devices. In an example, the described embodiments enable out-of-order processing of the circulant columns of the parity check matrix of the LDPC code based on a quality metric associated with the circulant columns, which advantageously reduces the latency of the BF decoder and improves convergence.

In one example, a method for reducing a latency of a decoder in a non-volatile memory is described. The method includes receiving a noisy codeword that is based on a transmitted codeword generated from a low-density parity-check (LDPC) code, the LDPC code having an associated parity matrix comprising a plurality of columns of circulant matrices. Then, performing a sorting operation that sorts the plurality of columns of circulant matrices in a descending order of a first quality metric to generate a plurality of sorted columns of circulant matrices, the first quality metric indicative of a number of errors in a corresponding column of circulant matrices, and iteratively processing the plurality of sorted columns of circulant matrices to determine a candidate version of the transmitted codeword. As part of the iteratively processing the plurality of sorted columns, the following operations are performed for each column of the plurality of sorted columns of circulant matrices: determining a second quality metric indicative of the number of errors in the column, comparing the second quality metric to at least one threshold, and in response to the comparing, selectively processing the column in an order determined by the sorting operation. Herein, processing the column comprises performing a message passing algorithm between a plurality of variable nodes and a plurality of check nodes that represent the parity matrix of the LDPC code to determine the candidate version of the transmitted codeword.

In another example, a system for reducing a latency of a decoder in a non-volatile memory is described. The system includes a processor and a memory including instructions stored thereupon, wherein the instructions, upon execution by the processor, cause the processor to receive a noisy codeword that is based on a transmitted codeword generated from a low-density parity-check (LDPC) code, the LDPC code having an associated parity matrix comprising a plurality of columns of circulant matrices, perform a sorting operation that sorts the plurality of columns of circulant matrices in a descending order of a first quality metric to generate a plurality of sorted columns of circulant matrices, the first quality metric indicative of a number of errors in a corresponding column of circulant matrices, and iteratively process the plurality of sorted columns of circulant matrices to determine a candidate version of the transmitted codeword. For each column of the plurality of sorted columns of circulant matrices, the instructions upon execution by the processor cause the processor, as part of iteratively processing the plurality of sorted columns, to determine a second quality metric indicative of the number of errors in the column, compare the second quality metric to at least one threshold, and in response to comparing, selectively process the column in an order determined by the sorting operation. Herein, processing the column comprises performing a message passing algorithm between a plurality of variable nodes and a plurality of check nodes that represent the parity matrix of the LDPC code to determine the candidate version of the transmitted codeword.

In yet another example, the methods may be embodied in the form of processor-executable instructions and stored on a computer-readable program medium.

The subject matter described in this patent document can be implemented in specific ways that provide one or more of the following features.

DETAILED DESCRIPTION

Solid-state drives (SSDs) are a new generation of storage device used in computers. SSDs replace traditional mechanical hard disks by using flash-based memory, which is significantly faster. SSDs speed up computers significantly due to their low read-access times and fast throughputs. SSDs can be configured to use low-density parity-check (LDPC) codes to correct any bit-errors in pages read from NAND media. LDPC codes are used to ensure data integrity in storage systems that use the new generation of NAND flash memories. Iterative decoders for LDPC codes have a wide range of complexities. The two primary types of decoders are the low-complexity bit-flipping decoder with low error-correction capability and the high-complexity min-sum (MS) decoder with high error-correction capability.

Bit-flipping (BF) decoders are typically configured to compute a flipping energy of variable nodes based on messages received from the neighboring check nodes and compare it to a threshold to decide whether the value of the variable node should be flipped. For typical SSD applications, most page reads (more than 95%) are by the BF decoder. However, existing implementations of BF decoders typically need extra cycles to determine which columns of the parity matrix of the LDPC code to process and further extra cycles to calculate the LDPC cyclic redundancy check (CRC) parity to check convergence. Thus, designing hardware for a fast and efficient BF decoder, which exhibits reduced latency, is critical especially in mobile and client SSD applications because of their strict power constraints and throughput requirements.

This patent document first overviews an example of a non-volatile memory system in which a bit-flipping decoder can be implemented to decode LDPC codes, and then describes methods, systems and devices to reduce the latency of the bit-flipping decoder by, for example, using an on-the-fly column quality (CQ) estimator to estimate the quality of each circulant column when decoding a codeword in a BF decoder. The CQ estimation can be performed without imposing additional latency, and can advantageously speed up convergence and enable skipping the processing of those circulant columns that do not contain any errors.

FIGS. 1-6 overview a non-volatile memory system (e.g., a flash-based memory, NAND flash) in which embodiments of the disclosed technology may be implemented.

Figure 1:
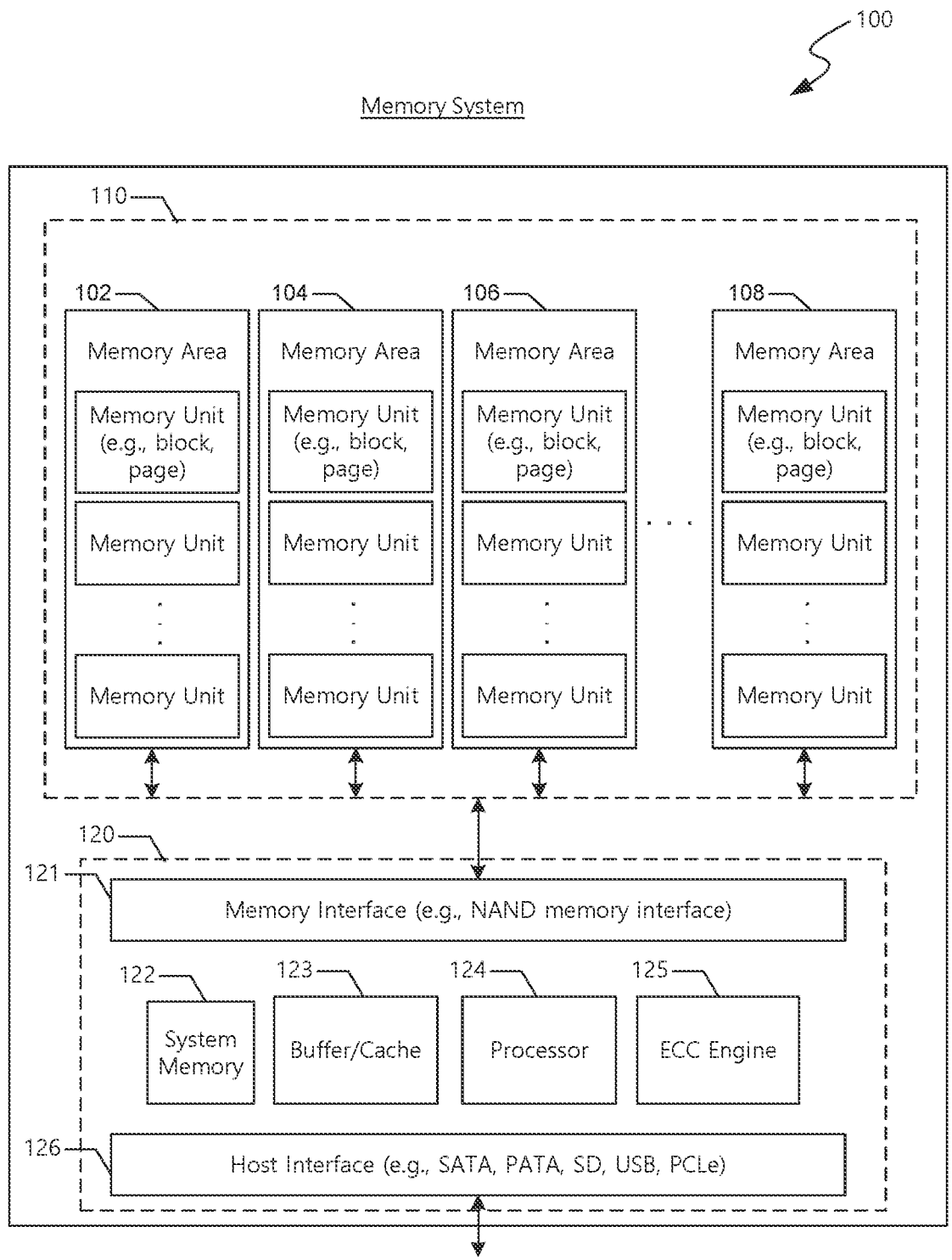
FIG. 1 illustrates an example of a memory system.

FIG. 1 is a block diagram of an example of a memory system 100 implemented based on some embodiments of the disclosed technology. The memory system 100 includes a memory module 110 that can be used to store information for use by other electronic devices or systems. The memory system 100 can be incorporated (e.g., located on a circuit board) in other electronic devices and systems. Alternatively, the memory system 100 can be implemented as an external storage device such as a USB flash drive and a solid-state drive (SSD).

The memory module 110 included in the memory system 100 can include memory areas (e.g., memory arrays) 102, 104, 106, and 108. Each of the memory areas 102, 104, 106, and 108 can be included in a single memory die or in multiple memory dice. The memory die can be included in an integrated circuit (IC) chip.

Each of the memory areas 102, 104, 106, and 108 includes a plurality of memory cells. Read, program, or erase operations can be performed on a memory unit basis. Thus, each memory unit can include a predetermined number of memory cells. The memory cells in a memory area 102, 104, 106, and 108 can be included in a single memory die or in multiple memory dice.

The memory cells in each of memory areas 102, 104, 106, and 108 can be arranged in rows and columns in the memory units. Each of the memory units can be a physical unit. For example, a group of a plurality of memory cells can form a memory unit. Each of the memory units can also be a logical unit. For example, the memory unit can be a block or a page that can be identified by a unique address such as a block address or a page address, respectively. For another example, wherein the memory areas 102, 104, 106, and 108 can include computer memories that include memory banks as a logical unit of data storage, the memory unit can be a bank that can be identified by a bank address. During a read or write operation, the unique address associated with a particular memory unit can be used to access that particular memory unit. Based on the unique address, information can be written to or retrieved from one or more memory cells in that particular memory unit.

The memory cells in the memory areas 102, 104, 106, and 108 can include non-volatile memory cells. Examples of non-volatile memory cells include flash memory cells, phase change random-access memory (PRAM) cells, magnetoresistive random-access memory (MRAM) cells, or other types of non-volatile memory cells. In an example implementation where the memory cells are configured as NAND flash memory cells, the read or write operation can be performed on a page basis. However, an erase operation in a NAND flash memory is performed on a block basis.

Each of the non-volatile memory cells can be configured as a single-level cell (SLC) or multiple-level memory cell. A single-level cell can store one bit of information per cell. A multiple-level memory cell can store more than one bit of information per cell. For example, each of the memory cells in the memory areas 102, 104, 106, and 108 can be configured as a multi-level cell (MLC) to store two bits of information per cell, a triple-level cell (TLC) to store three bits of information per cell, or a quad-level cells (QLC) to store four bits of information per cell. In another example, each of the memory cells in memory area 102, 104, 106, and 108 can be configured to store at least one bit of information (e.g., one bit of information or multiple bits of information), and each of the memory cells in memory area 102, 104, 106, and 108 can be configured to store more than one bit of information.

As shown in FIG. 1, the memory system 100 includes a controller module 120. The controller module 120 includes a memory interface 121 to communicate with the memory module 110, a host interface 126 to communicate with a host (not shown), a processor 124 to execute firmware-level code, and caches and memories 123 and 122, respectively to temporarily, or persistently, store executable firmware/instructions and associated information. In some implementations, the controller unit 120 can include an error correction engine 125 to perform error correction operation on information stored in the memory module 110. Error correction engine 125 can be configured to detect/correct single bit error or multiple bit errors. In another implementation, error correction engine 125 can be located in the memory module 110.

The host can be a device or a system that includes one or more processors that operate to retrieve data from the memory system 100 or store or write data into the memory system 100. In some implementations, examples of the host can include a personal computer (PC), a portable digital device, a digital camera, a digital multimedia player, a television, and a wireless communication device.

In some implementations, the controller module 120 can also include a host interface 126 to communicate with the host. Host interface 126 can include components that comply with at least one of host interface specifications, including but not limited to, Serial Advanced Technology Attachment (SATA), Serial Attached Small Computer System Interface (SAS) specification, Peripheral Component Interconnect Express (PCIe).

Figure 2:
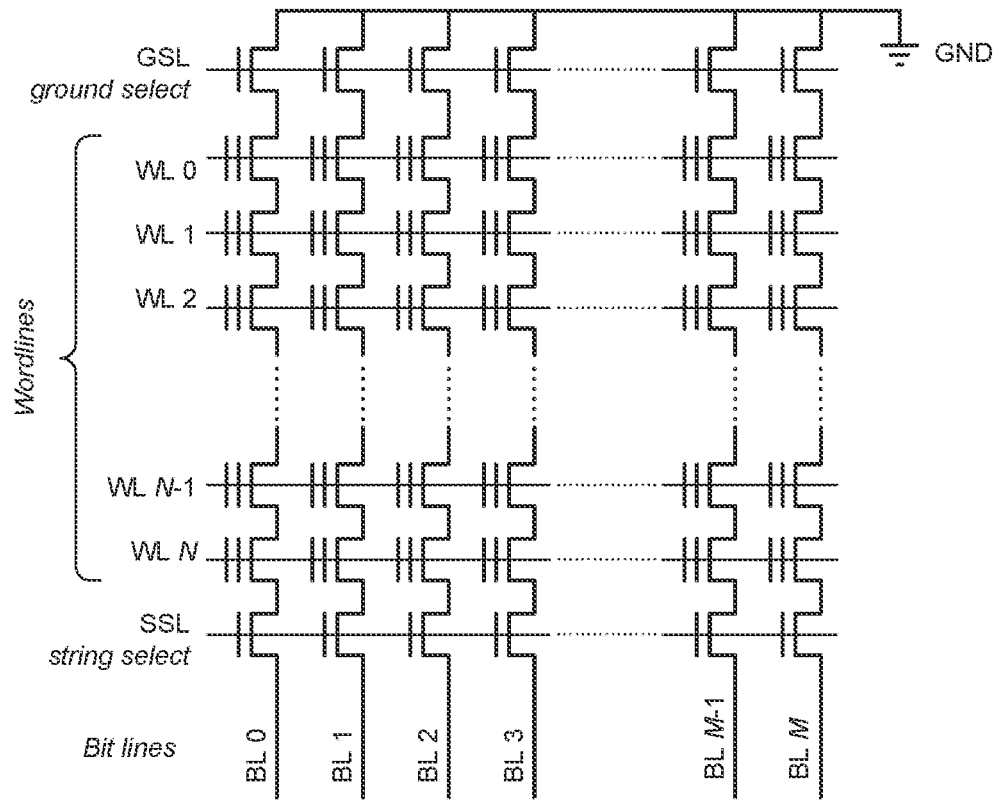
FIG. 2 is an illustration of an example non-volatile memory device.

FIG. 2 illustrates an example of a memory cell array implemented based on some embodiments of the disclosed technology.

In some implementations, the memory cell array can include NAND flash memory array that is partitioned into many blocks, and each block contains a certain number of pages. Each block includes a plurality of memory cell strings, and each memory cell string includes a plurality of memory cells.

In some implementations where the memory cell array is NAND flash memory array, read and write (program) operations are performed on a page basis, and erase operations are performed on a block basis. All the memory cells within the same block must be erased at the same time before performing a program operation on any page included in the block. In an implementation, NAND flash memories may use an even/odd bit-line structure. In another implementation, NAND flash memories may use an all-bit-line structure. In the even/odd bit-line structure, even and odd bit-lines are interleaved along each word-line and are alternatively accessed so that each pair of even and odd bit-lines can share peripheral circuits such as page buffers. In all-bit-line structure, all the bit-lines are accessed at the same time.

Figure 3:
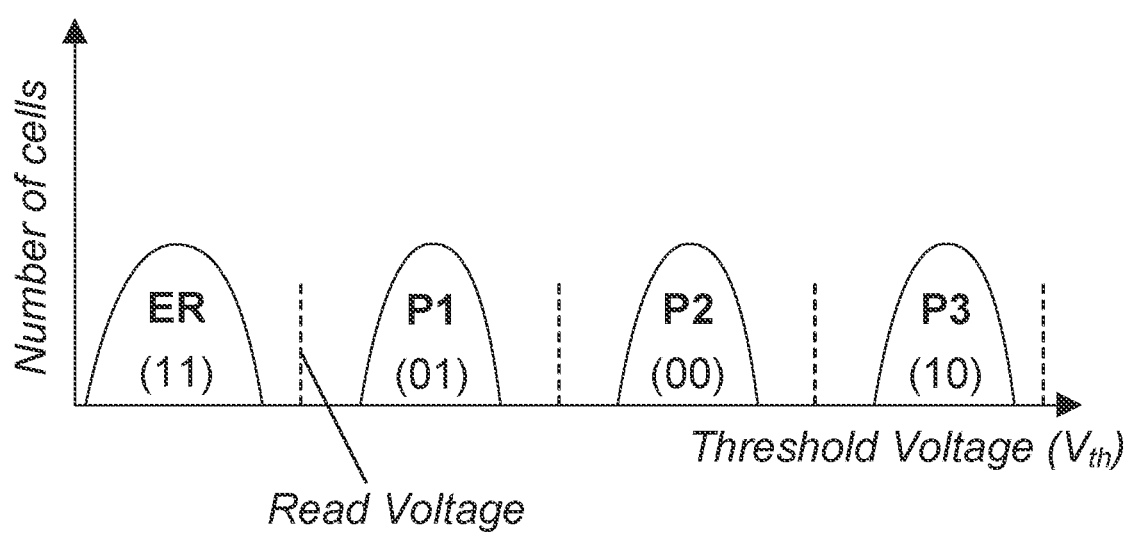
FIG. 3 is an example diagram illustrating the cell voltage level distribution (V t h) of a non-volatile memory device.

FIG. 3 illustrates an example of threshold voltage distribution curves in a multi-level cell device, wherein the number of cells for each program/erase state is plotted as a function of the threshold voltage. As illustrated therein, the threshold voltage distribution curves include the erase state (denoted "ER" and corresponding to "11") with the lowest threshold voltage, and three program states (denoted "P1", "P2" and "P3" corresponding to "01", "00" and "10", respectively) with read voltages in between the states (denoted by the dotted lines). In some embodiments, each of the threshold voltage distributions of program/erase states has a finite width because of differences in material properties across the memory array.

Although FIG. 3 shows a multi-level cell device by way of example, each of the memory cells can be configured to store any number of bits per cell. In some implementations, each of the memory cells can be configured as a single-level cell (SLC) to store one bit of information per cell, or as a triple-level cell (TLC) to store three bits of information per cell, or as a quad-level cells (QLC) to store four bits of information per cell.

In writing more than one data bit in a memory cell, fine placement of the threshold voltage levels of memory cells is needed because of the reduced distance between adjacent distributions. This is achieved by using incremental step pulse program (ISPP), i.e., memory cells on the same word-line are repeatedly programmed using a program-and-verify approach with a staircase program voltage applied to word-lines. Each programmed state associates with a verify voltage that is used in verify operations and sets the target position of each threshold voltage distribution window.

Read errors can be caused by distorted or overlapped threshold voltage distribution. An ideal memory cell threshold voltage distribution can be significantly distorted or overlapped due to, e.g., program and erase (P/E) cycle, cell-to-cell interference, and data retention errors, which will be discussed in the following, and such read errors may be managed in most situations by using error correction codes (ECCO).

Figure 4:
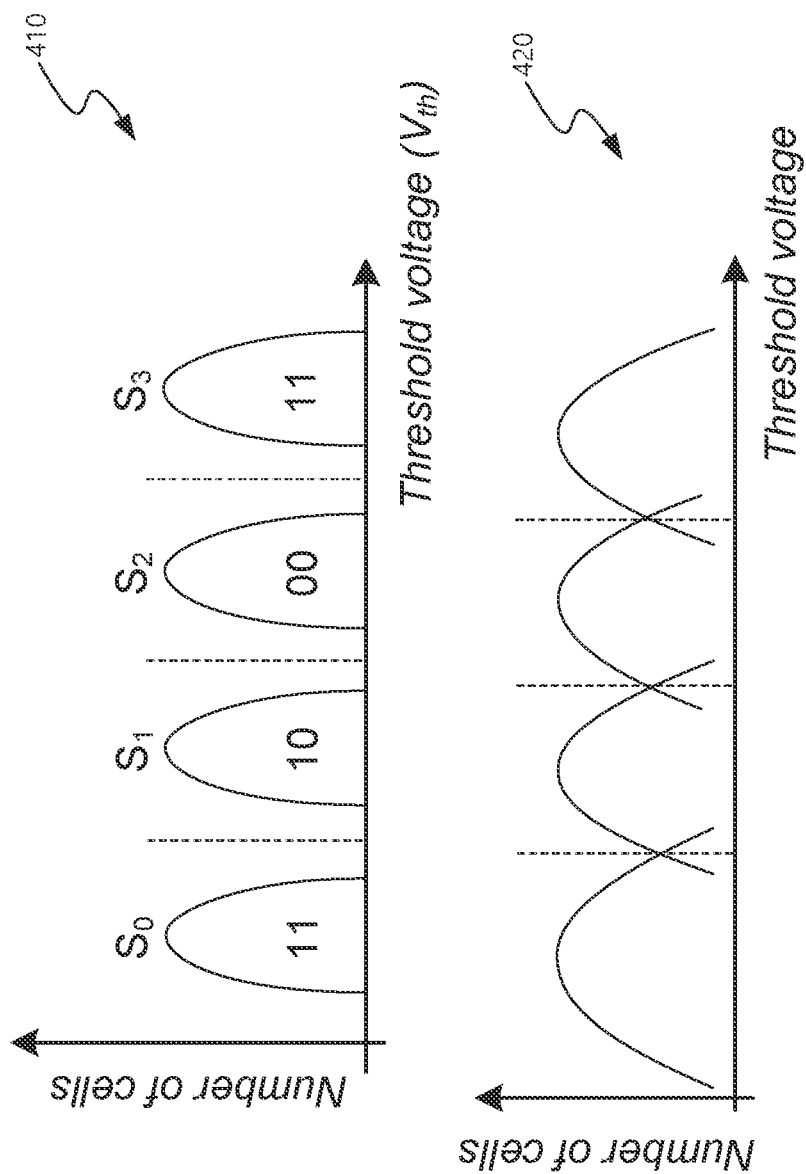
FIG. 4 is another example diagram illustrating the cell voltage level distribution (V t h) of a non-volatile memory device.

FIG. 4 illustrates an example of ideal threshold voltage distribution curves 410 and an example of distorted threshold voltage distribution curves 420. The vertical axis indicates the number of memory cells that has a particular threshold voltage represented on the horizontal axis.

For n-bit multi-level cell NAND flash memory, the threshold voltage of each cell can be programmed to $2n$ possible values. In an ideal multi-level cell NAND flash memory, each value corresponds to a non-overlapping threshold voltage window.

Flash memory P/E cycling causes damage to a tunnel oxide of floating gate of a charge trapping layer of cell transistors, which results in threshold voltage shift and thus gradually degrades memory device noise margin. As P/E cycles increase, the margin between neighboring distributions of different programmed states decreases and eventually the distributions start overlapping. The data bit stored in a memory cell with a threshold voltage programmed in the overlapping range of the neighboring distributions may be misjudged as a value other than the original targeted value.

Figure 5:
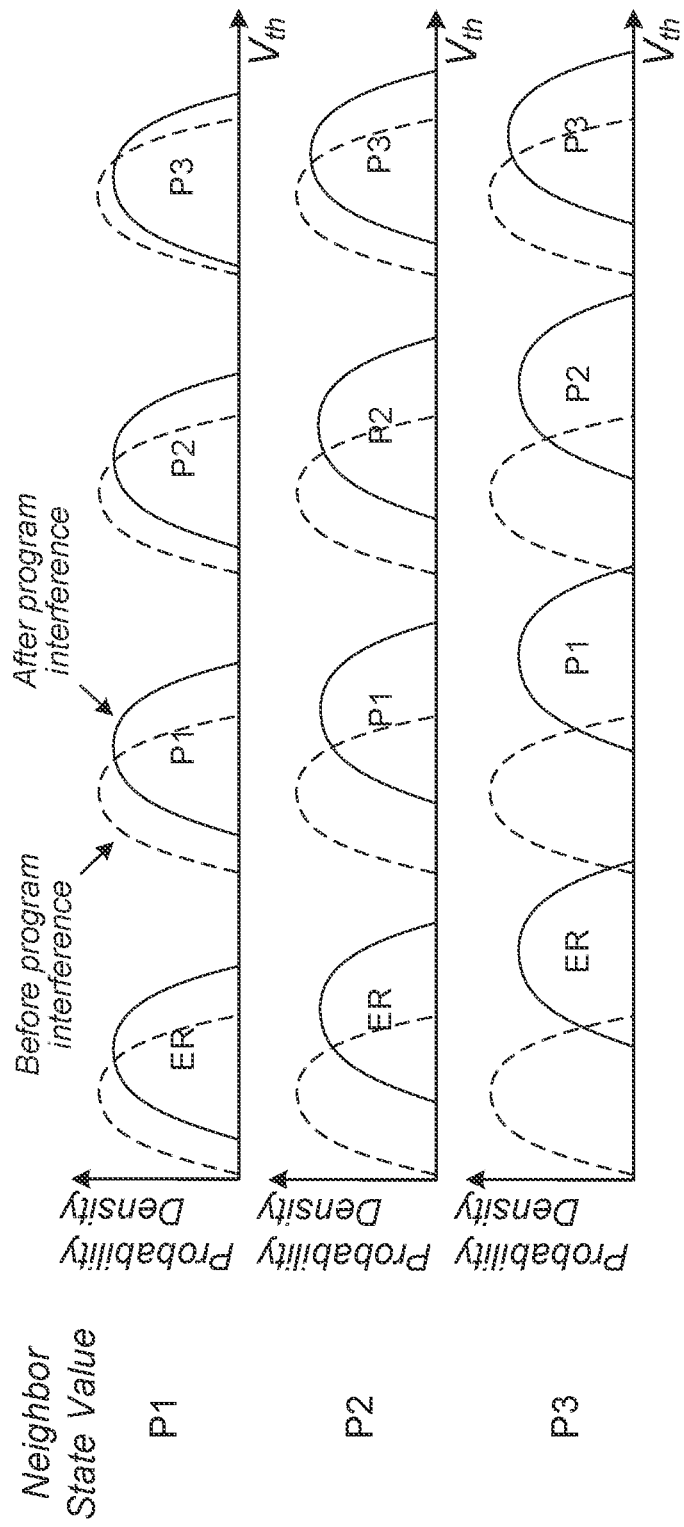
FIG. 5 is an example diagram illustrating the cell voltage level distribution (V t h) of a non-volatile memory device before and after program interference.

FIG. 5 illustrates an example of a cell-to-cell interference in NAND flash memory. The cell-to-cell interference can also cause threshold voltages of flash cells to be distorted. The threshold voltage shift of one memory cell transistor can influence the threshold voltage of its adjacent memory cell transistor through parasitic capacitance-coupling effect between the interfering cell and the victim cell. The amount of the cell-to-cell interference may be affected by NAND flash memory bit-line structure. In the even/odd bit-line structure, memory cells on one word-line are alternatively connected to even and odd bit-lines and even cells are programmed ahead of odd cells in the same word-line. Therefore, even cells and odd cells experience different amount of cell-to-cell interference. Cells in all-bit-line structure suffer less cell-to-cell interference than even cells in the even/odd bit-line structure, and the all-bit-line structure can effectively support high-speed current sensing to improve the memory read and verify speed.

The dotted lines in FIG. 5 denote the nominal distributions of P/E states (before program interference) of the cells under consideration, and the "neighbor state value" denotes the value that the neighboring state has been programmed to. As illustrated in FIG. 5, if the neighboring state is programmed to P1, the threshold voltage distributions of the cells under consideration shift by a specific amount. However, if the neighboring state is programmed to P2, which has a higher threshold voltage than P1, that results in a greater shift compared to the neighboring state being P1. Similarly, the shift in the threshold voltage distributions is greatest when the neighboring state is programmed to P3.

Figure 6:
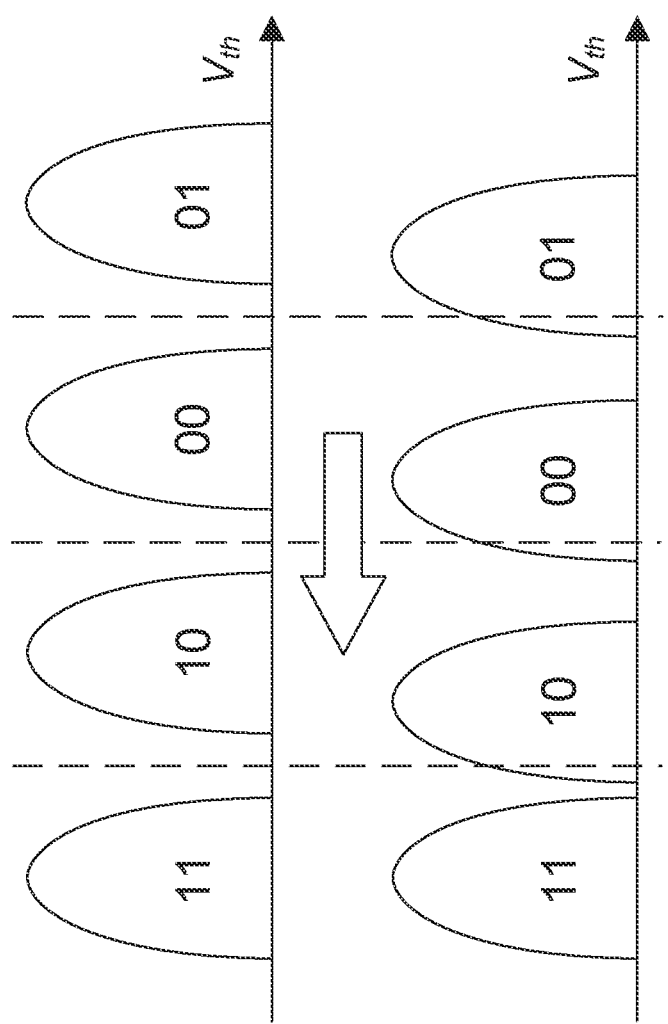
FIG. 6 is an example diagram illustrating the cell voltage level distribution (V t h) of a non-volatile memory device as a function of the reference voltage.

FIG. 6 illustrates an example of a retention error in NAND flash memory by comparing normal threshold-voltage distribution and shifted threshold-voltage distribution. The data stored in NAND flash memories tend to get corrupted over time and this is known as a data retention error. Retention errors are caused by loss of charge stored in the floating gate or charge trap layer of the cell transistor. Due to wear of the floating gate or charge trap layer, memory cells with more program erase cycles are more likely to experience retention errors. In the example of FIG. 6, comparing the top row of voltage distributions (before corruption) and the bottom row of distributions (contaminated by retention error) reveals a shift to the left.

For a particular codeword being read in a NAND-based storage system (e.g., the examples illustrated in FIGS. 1-6), as fewer and fewer errors are left to be decoded, most of the BF decoder cycles are wasted processing circulant columns in which there are no errors. In order to correct the final few errors, a BF decoder operating in-order typically iterates over the same column multiple times in an effort to correct the final few errors. This increases latency, wastes energy, and degrades performance.

Existing implementations of out-of-order BF decoders enable only circulant columns that have a high probability of containing errors to be processed. However, additional cycles are needed to identify these columns. Furthermore, at the end of each iteration, yet more cycles are needed to calculate the CRC. Embodiments of the disclosed technology are directed to out-of-order BF decoders that do not need extra cycles to determine which columns to be processed or for computing the CRC. This advantageously reduces decoding latency and the power consumed, and improves convergence of the BF decoder.

In some embodiments, the flipping energy of a BF decoder is computed as:

$$E(i) = \sum_{\forall j s.t. H(i,j)=1} s_{old}(j) + (\text{dec\_prev}(i) \neq chn(i)).$$

Herein, $s_{old}$ is the syndrome, dec_prev is the current value of the variable node, and chn(i) is the channel value.

In some embodiments, the out-of-order BF decoder is configured with an on-the-fly column quality (CQ) estimator that is used to estimate the quality of each circulant column. The CQ estimator is based on a partial group sort algorithm and can estimate the column quality on-the-fly without imposing additional latency. The CQ estimator can be applied when certain conditions are met. For example, an initial checksum-based CQ estimator can help speed up convergence compared to traditional in-order BF decoders. Using the CQ estimator in later iterations enable the skipping of circulant columns that do not contain errors, thereby reducing latency by reducing the processing performed.

In some embodiments, the column quality (denoted "cq") can be computed as the maximum value of the unsatisfied check nodes on a bit in a particular circulant column. In other embodiments, the average value of the unsatisfied check nodes in all the bits in the particular column may be used.

In some embodiments, the partial group sort algorithm includes partitioning the circulant columns into multiple groups such that a first group has (cq≤2), a second group has (cq==3), a third group has (cq==4), and a fourth group has (cq≥5). In an example, two arrays of $N_{col}$ int8 registers (wherein $N_{col}$ is the total number of columns) can be used to record the column indices of the sorting; the first array for the column indices in the previous iteration and the second array for the column indices in the current iteration.

In some embodiments, an example of the group sort based CQ estimator uses the following variables:
qccsNpt, which is a counter for an N-th group, e.g., qccs5pt corresponds to the fourth group and qccs2pt corresponds to the first group;
colperm, which is the array used to store the column indices;
cq(i), which is the quality metric computed for the i-th circulant column; and
qccnt, which is a counter for the circulant columns.

The algorithm for the group sort based CQ estimator includes an initialization step and a processing step that processes a circulant column.

Initialization step, the pointer is set to the next available slot of each segment:
qccs5pt=1;
qccs4pt=1;
qccs3pt=1;
qccs2pt=1;
colperm=zeros (1,129);
qccnt=0;

Processing step, the column quality for the i-th circulant column is computed, and the following operations performed to insert the column index into the sorted array:

```
if cs(i)>=5
    colperm(qccs5pt+1:end) = colperm(qccs5pt:end-1);
    colperm(qccs5pt)=i;
    qccnt = qccnt+1;
    qccs5pt=min(maxlen+1,qccs5pt+1);
    qccs4pt=min(maxlen+1,qccs4pt+1);
    qccs3pt=min(maxlen+1,qccs3pt+1);
end
if cs(i)==4
    colperm(qccs4pt+1:end) = colperm(qccs4pt:end-1);
    colperm(qccs4pt)=i;
    qccnt = qccnt+1;
    qccs4pt=min(maxlen+1,qccs4pt+1);
    qccs3pt=min(maxlen+1,qccs3pt+1);
end
if cs(i)==3
    colperm(qccs3pt+1:end) = colperm(qccs3pt:end-1);
    colperm(qccs3pt)=i;
    qccnt = qccnt+1;
    qccs3pt=min(maxlen+1,qccs3pt+1);
end
if cs(i)<=2
    colperm(qccs2pt+1:end) = colperm(qccs2pt:end-1);
    colperm(qccs2pt)=i;
    qccnt = qccnt+1;
    qccs2pt=min(maxlen+1,qccs2pt+1);
end
```

In some embodiments, the algorithm for the group sort based CQ estimator includes:

Sorting during data transfer and initial check-sum calculation. During data transfer from an external data buffer into the internal buffer of the decoder, the initial checksum is calculated and the max column quality in each circulant column is recorded as cq. Sorting is performed during the cq calculations so that at the end of data transfer, the circulant columns are sorted according to decreasing order of cq.

Sorting during decoding. In the decoding process, the decoder may process columns in the sorted order (e.g., from the sorting operation in the previous iteration). During decoding, cq for the column under processing will be calculated while a new sorting operation is running for the current iteration. Thus, as noted earlier, two arrays of int8 values are needed to store the results of the sorting operation.

CRC calculation. When the decoder converges, the CRC is checked to ensure that it passes. If the decoder processes the columns in an out-of-order manner, the CRC calculation cannot be performed. To perform CRC calculation, the decoder will switch to in-order mode when checksum is lower than certain threshold, or decoding is about to converge. In the in-order processing mode, CRC will be calculated and check the convergence.

Column skipping. At the later stages of decoding, there are few errors left and most of the columns have no error. In this case, the out-of-order BF decoder may skip columns which have cq equal to 0 and do not need to be processed. This operation reduces latency and improves throughput. It is noted that column skipping and operating in the in-order mode (e.g., for CRC calculations) cannot be enabled at the same time.

Figure 7:
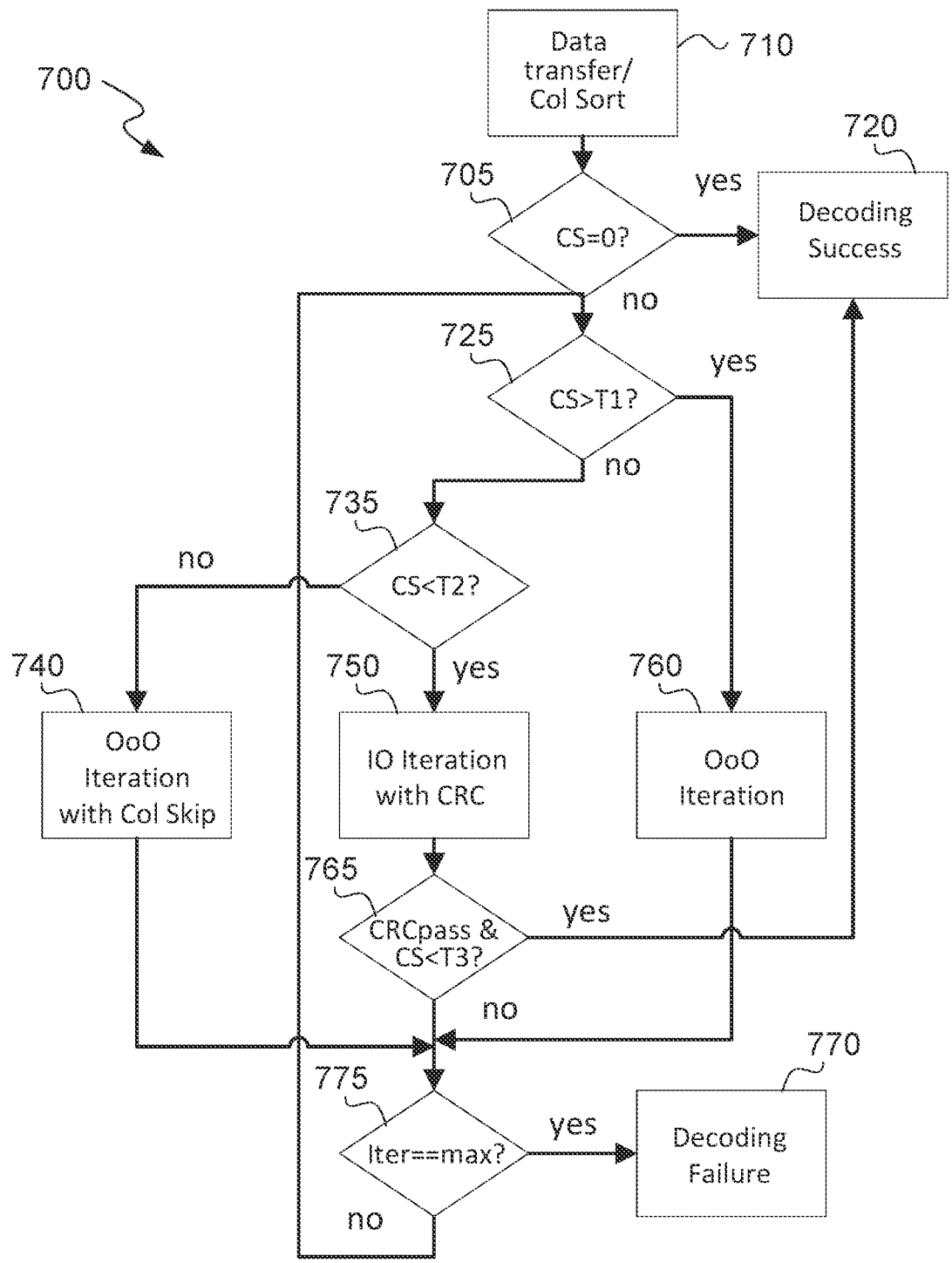
FIG. 7 illustrates a flowchart of an example method for reducing a latency of a decoder in a non-volatile memory.

In some embodiments, the above operations are further explained in the context of FIG. 7, which illustrates a flowchart of an example method for reducing a latency of a decoder in a non-volatile memory. A shown in FIG. 7, the data transfer and initial column sorting operation is first performed (710). If the checksum (CS) is zero ("yes" at 705), the decoding operation is successful (720), and the BF decoder can return the candidate codeword that has been determined. However, if CS is not equal to zero ("no" at 705), then CS is compared to a first threshold T1 (725). The threshold T1 is configured to have a high value (compared to the other thresholds, e.g., T2 and T3) such that if CS is greater than T1 ("yes" at 725), then an out-of-order iteration because this particular column is an especially noisy (or error-prone) column based on its CS exceeding the highest threshold. This allows the algorithm to first focus on decoding columns with a fewer number of errors. The out-of-order iteration is following by checking whether the maximum number of iterations has been reached (775).

On the other hand, if the CS is less than T1 ("no" at 725), then CS is compared to a second threshold T2 (735). If CS is greater than T2 ("no at 735), which implies that this column still has a fair number of errors, an out-of-order iteration with column skip is performed, which is followed by checking whether the maximum number of iterations has been reached (775).

If CS if less than T2 ("yes" at 735), then an in-order (IO) iteration as well as the CRC calculation are performed (750). If the CRC passes and CS is less than a third threshold T3 ("yes" at 765), then the decoding operation is successful (720). The threshold T3 is configured to be lower than both T1 and T2 to ensure that if CS is less than T3, then the algorithm can declare that the decoding operation has been successful. If either the CRC fails or CS is greater than T3 ("no" at 765), the algorithm checks whether the maximum number of iterations has been reached (775). If the maximum number of iterations has been reached ("yes" at 775), then a decoding failure is declared (770), but if this is not the case ("no" at 775), then decoding continues.

In some embodiments, the maximum number of iterations is a predefined value.

In some embodiments, the method described in FIG. 7 can be configured to use more than three thresholds (e.g., T1≥T2≥T3≥ . . . ≥TN). In this example, T1 and TN correspond to T1 and T3 in FIG. 7 (corresponding to the highest and lowest thresholds, respectively), and multiple intermediate thresholds T2, T3, . . . , T(N−1) can be used instead of the single threshold T2 in FIG. 7. CS can be compared to each of the intermediate thresholds to determine whether a column should be temporarily skipped or permanently skipped, and in what order a particular circulant column should be processed to reduce the latency and improve convergence.

Figure 8:
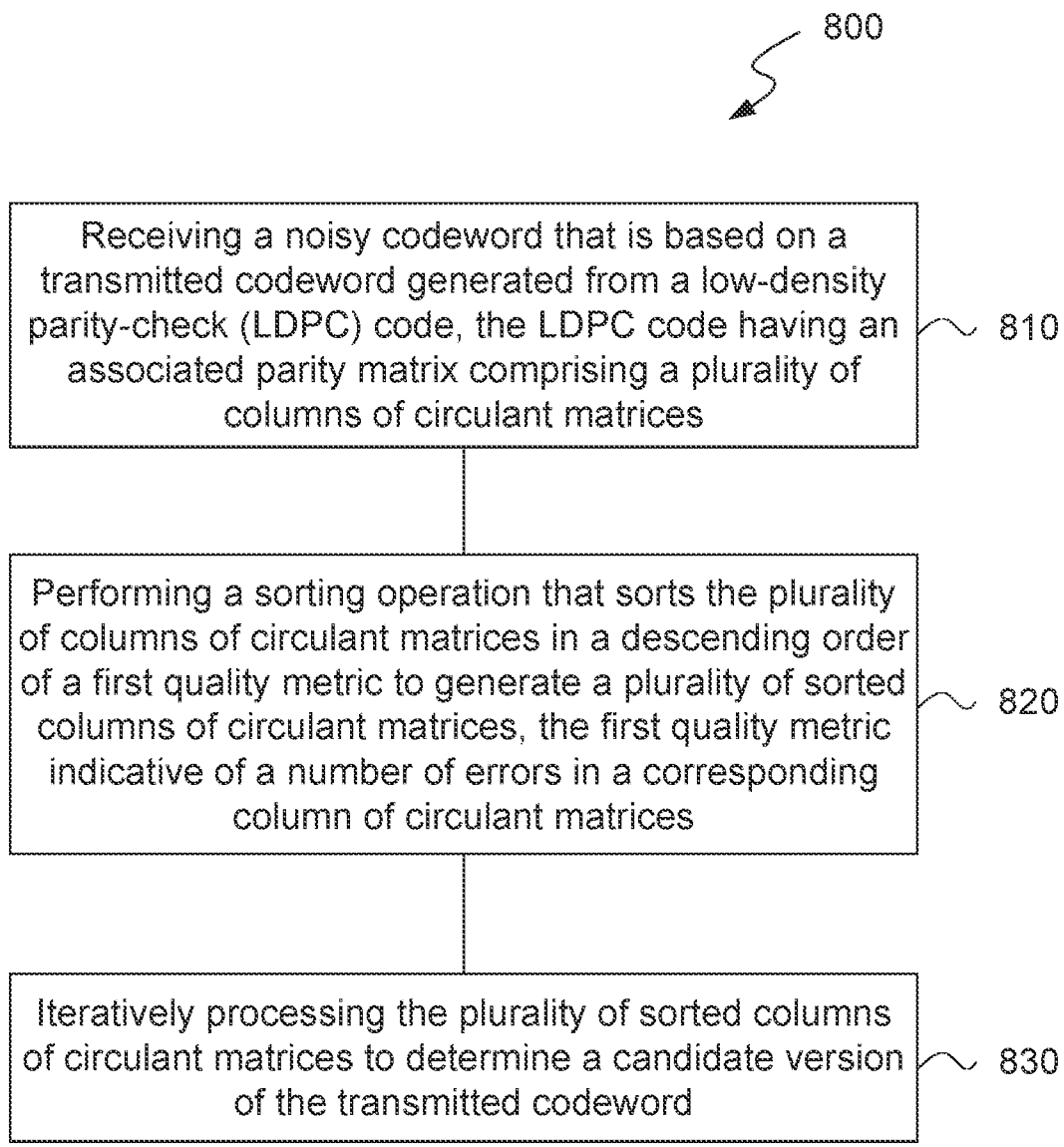
FIG. 8 illustrates a flowchart of another example method for reducing a latency of a decoder in a non-volatile memory.

FIG. 8 illustrates a flowchart of an example method 800 for reducing a latency of a decoder in a non-volatile memory. The method 800 includes, at operation 810, receiving a noisy codeword that is based on a transmitted codeword generated from a low-density parity-check (LDPC) code, the LDPC code having an associated parity matrix comprising a plurality of columns of circulant matrices.

The method 800 includes, at operation 820, performing a sorting operation that sorts the plurality of columns of circulant matrices in a descending order of a first quality metric to generate a plurality of sorted columns of circulant matrices, the first quality metric indicative of a number of errors in a corresponding column of circulant matrices.

The method 800 includes, at operation 830, iteratively processing the plurality of sorted columns of circulant matrices to determine a candidate version of the transmitted codeword.

In some embodiments, for each column of the plurality of sorted columns of circulant matrices, iteratively processing the plurality of sorted columns comprises determining a second quality metric indicative of the number of errors in the column, comparing the second quality metric to at least one threshold, and in response to the comparing, selectively processing the column in an order determined by the sorting operation, wherein processing the column comprises performing a message passing algorithm between a plurality of variable nodes and a plurality of check nodes that represent the parity matrix of the LDPC code to determine the candidate version of the transmitted codeword.

In an example, selectively processing the column in an order determined by the sorting operation comprises processing the column in a first order if the second quality metric is greater than a threshold and in a second order if the second quality metric is less than or equal to the threshold (or vice versa). In another example, selectively processing a column in an order determined by the sorting operation comprises processing the column in the determined order if the second quality metric is greater than or equal to a threshold, and not processing the column if the second quality metric is less than the threshold (or vice versa).

In some embodiments, the method 800 further comprises prior to performing the sorting operation, determining, for each circulant column of the plurality of columns of circulant matrices, the first quality metric, wherein the first quality metric is based on a number of unsatisfied check nodes associated with a bit in the corresponding circulant column.

In some embodiments, the first quality metric is a maximum value of the number of unsatisfied check nodes across all bits in the corresponding circulant column.

In some embodiments, the first quality metric is an average value of the number of unsatisfied check nodes across all bits in the corresponding circulant column.

In some embodiments, the second quality metric is a checksum.

In some embodiments, the first quality metric is a checksum.

In some embodiments, the at least one threshold is selected from a plurality of thresholds that comprises a first threshold ($T_1$), one or more intermediate thresholds ($T_{N-1}$), and a final threshold ($T_N$), and wherein $T_1 < T_{N-1} < T_N$. For example, and as shown in FIG. 7, N=3. In other embodiments, the one or more intermediate thresholds ($T_2$, $T_3$, . . . , $T_{N-1}$) may be selected such that $T_1 < T_2 < T_3 < \ldots < T_{N-1} < T_N$.

In some embodiments, the at least one threshold is the first threshold, and the method 800, as part of selectively processing the column, further comprises in response to the second quality metric exceeding the first threshold, refraining from processing the column corresponding to the second quality metric.

In some embodiments, the at least one threshold is one of the one or more intermediate thresholds, and the method 800, as part of selectively processing the column, further comprises in response to the second quality metric being less than the one of the one or more intermediate thresholds, processing the column corresponding to the second quality metric in the order determined by the sorting operation, and computing a cyclic redundancy check (CRC) for the plurality of columns of circulant matrices.

In some embodiments, the at least one threshold is the final threshold, and the method 800, as part of selectively processing the column, further comprises in response to the second quality metric being less than the final threshold and the CRC passing, refraining from performing a subsequent iteration.

In some embodiments, the method 800 further comprises refraining from performing a subsequent iteration upon a determination that a checksum for the candidate transmitted codeword is equal to zero or a maximum number of iterations has been performed.

Embodiments of the disclosed include an apparatus for reducing a latency of a decoder in a non-volatile memory. The apparatus includes a processor and a memory including instructions stored thereupon, wherein the instructions, upon execution by the processor, cause the processor to receive a noisy codeword that is based on a transmitted codeword generated from a low-density parity-check (LDPC) code, the LDPC code having an associated parity matrix comprising a plurality of columns of circulant matrices, perform a sorting operation that sorts the plurality of columns of circulant matrices in a descending order of a first quality metric to generate a plurality of sorted columns of circulant matrices, the first quality metric indicative of a number of errors in a corresponding column of circulant matrices, and iteratively process the plurality of sorted columns of circulant matrices to determine a candidate version of the transmitted codeword. For each column of the plurality of sorted columns of circulant matrices, the instructions upon execution by the processor cause the processor, as part of iteratively processing the plurality of sorted columns, to determine a second quality metric indicative of the number of errors in the column, compare the second quality metric to at least one threshold, and in response to comparing, selectively process the column in an order determined by the sorting operation. Herein, processing the column comprises performing a message passing algorithm between a plurality of variable nodes and a plurality of check nodes that represent the parity matrix of the LDPC code to determine the candidate version of the transmitted codeword.

Figure 9:
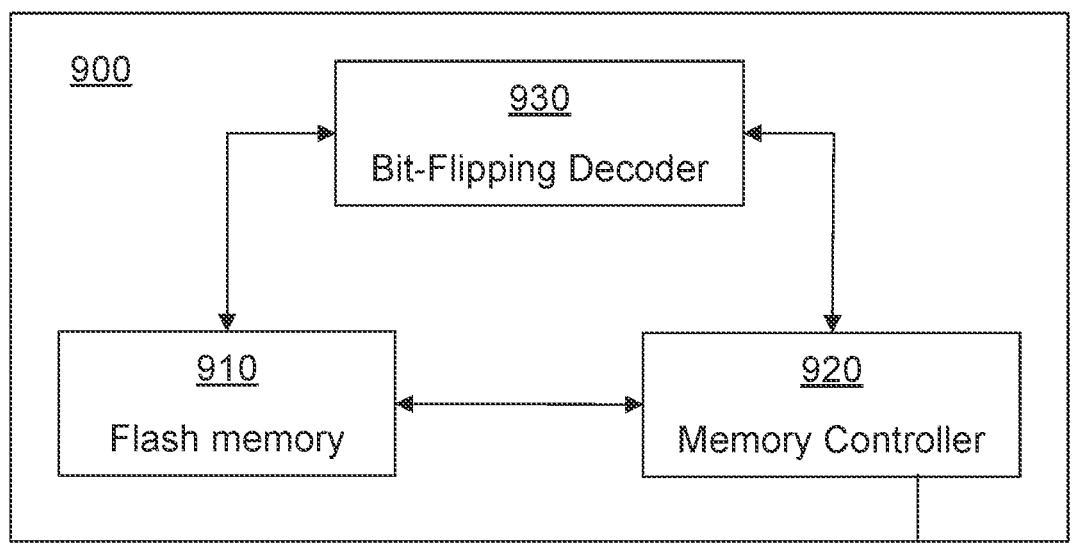
FIG. 9 is an example diagram illustrating a storage device that can be configured to implement the described embodiments.

FIG. 9 is an example diagram illustrating a storage device that can be configured to implement the described embodiments. Referring to FIG. 9, a data storage device 900 may include a flash memory 910, a memory controller 920, and a bit-flipping (BF) decoder 930. The memory controller 920 may control the flash memory 910 and the BF decoder 930 in response to control signals input from the outside of the data storage device 900. In the data storage device 900, the flash memory 910 may be configured the same or substantially the same as a nonvolatile memory device. That is, the flash memory 910 may read data from selected memory cells to output it to the memory controller 920. The read data may be decoded using the BF decoder 930 prior to outputting it to the memory controller 920 based on the embodiments described in this document.

In some embodiments, the data storage device 900 may be a memory card device, an SSD device, a multimedia card device, an SD card, a memory stick device, an HDD device, a hybrid drive device, or an USB flash device. For example, the data storage device 900 may be a card which satisfies the standard for user devices such as a digital camera, a personal computer, and so on.

In some embodiments, the BF decoder 930 may be configured to implement the methods described in FIGS. 7 and 8, and the embodiments described in this patent document.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method for reducing a latency of a decoder in a non-volatile memory, comprising:
    receiving a noisy codeword that is based on a transmitted codeword generated from a low-density parity-check (LDPC) code, the LDPC code having an associated parity matrix comprising a plurality of columns of circulant matrices;
    performing a sorting operation that sorts the plurality of columns of circulant matrices in a descending order of a first quality metric to generate a plurality of sorted columns of circulant matrices, the first quality metric indicative of a number of errors in a corresponding column of circulant matrices; and
    iteratively processing the plurality of sorted columns of circulant matrices to determine a candidate version of the transmitted codeword,
    wherein, for each column of the plurality of sorted columns of circulant matrices, iteratively processing the plurality of sorted columns comprises:
        determining a second quality metric indicative of the number of errors in the column,
        comparing the second quality metric to at least one threshold, and
        in response to the comparing, selectively processing the column in an order determined by the sorting operation,
        wherein the selectively processing the column comprises performing a message passing algorithm between a plurality of variable nodes and a plurality of check nodes that represent the parity matrix of the LDPC code to determine the candidate version of the transmitted codeword.

2. The method of claim 1, further comprising:
    prior to performing the sorting operation, determining, for each circulant column of the plurality of columns of circulant matrices, the first quality metric, wherein the first quality metric is based on a number of unsatisfied check nodes associated with a bit in the corresponding circulant column.

3. The method of claim 2, wherein the first quality metric is a maximum value of the number of unsatisfied check nodes across all bits in the corresponding circulant column.

4. The method of claim 2, wherein the first quality metric is an average value of the number of unsatisfied check nodes across all bits in the corresponding circulant column.

5. The method of claim 1, wherein the second quality metric is a checksum.

6. The method of claim 5, wherein the first quality metric is a checksum.

7. The method of claim 1, wherein the at least one threshold is selected from a plurality of thresholds that comprises a first threshold ($T_1$), one or more intermediate thresholds ($T_{N-1}$), and a final threshold ($T_N$), and wherein $T_1 < T_N - 1 < T_N$.

8. The method of claim 7, wherein the at least one threshold is the first threshold, and wherein the method, as part of the selectively processing the column, comprises:
    in response to the second quality metric exceeding the first threshold, refraining from processing the column corresponding to the second quality metric.

9. The method of claim 7, wherein the at least one threshold is one of the one or more intermediate thresholds, and wherein the method, as part of the selectively processing the column, comprises:
    in response to the second quality metric being less than the one of the one or more intermediate thresholds,
        processing the column corresponding to the second quality metric in the order determined by the sorting operation, and
        computing a cyclic redundancy check (CRC) for the plurality of columns of circulant matrices.

10. The method of claim 9, wherein the at least one threshold is the final threshold, and wherein the method, as part of the selectively processing the column, comprises:
    in response to the second quality metric being less than the final threshold and the CRC passing, refraining from performing a subsequent iteration.

11. A system reducing a latency of a decoder in a non-volatile memory, comprising:
    a processor and a memory including instructions stored thereupon, wherein the instructions, upon execution by the processor, cause the processor to:
        receive a noisy codeword that is based on a transmitted codeword generated from a low-density parity-check (LDPC) code, the LDPC code having an associated parity matrix comprising a plurality of columns of circulant matrices;
        perform a sorting operation that sorts the plurality of columns of circulant matrices in a descending order of a first quality metric to generate a plurality of sorted columns of circulant matrices, the first quality metric indicative of a number of errors in a corresponding column of circulant matrices; and
        iteratively process the plurality of sorted columns of circulant matrices to determine a candidate version of the transmitted codeword,
    wherein, for each column of the plurality of sorted columns of circulant matrices, the instructions upon execution by the processor cause the processor, as part of iteratively processing the plurality of sorted columns, to:
        determine a second quality metric indicative of the number of errors in the column,
        compare the second quality metric to at least one threshold, and
        in response to comparing, selectively process the column in an order determined by the sorting operation,
        wherein processing the column comprises performing a message passing algorithm between a plurality of variable nodes and a plurality of check nodes that represent the parity matrix of the LDPC code to determine the candidate version of the transmitted codeword.

12. The system of claim 11, wherein the instructions, upon execution by the processor, cause the processor to:
prior to performing the sorting operation, determine, for each circulant column of the plurality of columns of circulant matrices, the first quality metric, wherein the first quality metric is based on a number of unsatisfied check nodes associated with a bit in the corresponding circulant column.

13. The system of claim 11, wherein the first quality metric is a maximum value or an average value of a number of unsatisfied check nodes across all bits in the corresponding circulant column.

14. The system of claim 11, wherein the at least one threshold is selected from a plurality of thresholds that comprises a first threshold ($T_1$), one or more intermediate thresholds ($T_{N-1}$), and a final threshold ($T_N$), and wherein $T_1 < T_N - 1 < T_N$.

15. The system of claim 14, wherein the at least one threshold is the first threshold, and wherein the instructions, upon execution by the processor, cause the processor, as part of selectively processing the column, to:
in response to the second quality metric exceeding the first threshold, refrain from processing the column corresponding to the second quality metric.

16. The system of claim 14, wherein the at least one threshold is one of the one or more intermediate thresholds, and wherein the instructions, upon execution by the processor, cause the processor, as part of selectively processing the column, to:
in response to the second quality metric being less than the one of the one or more intermediate thresholds,
process the column corresponding to the second quality metric in the order determined by the sorting operation, and
compute a cyclic redundancy check (CRC) for the plurality of columns of circulant matrices.

17. The system of claim 16, wherein the at least one threshold is the final threshold, and wherein the instructions, upon execution by the processor, cause the processor, as part of selectively processing the column, to:
in response to the second quality metric being less than the final threshold and the CRC passing, refrain from performing a subsequent iteration.

18. The system of claim 11, wherein the instructions, upon execution by the processor, cause the processor, as part of selectively processing the column, to:
process the column in a first order in response to the second quality metric being greater than the at least one threshold; and
process the column in a second order in response to the second quality metric being less than or equal to the at least one threshold.

19. The system of claim 11, wherein the instructions, upon execution by the processor, cause the processor, as part of selectively processing the column, to:
process the column in the order determined by the sorting operation in response to the second quality metric being less than or equal to the at least one threshold; and
refrain from processing the column in response to the second quality metric being greater than the at least one threshold.

20. A non-transitory computer-readable storage medium having instructions stored thereupon for reducing a latency of a decoder in a non-volatile memory, the instructions, when executed by a processor, cause the processor to perform operations comprising:
receiving a noisy codeword that is based on a transmitted codeword generated from a low-density parity-check (LDPC) code, the LDPC code having an associated parity matrix comprising a plurality of columns of circulant matrices;
performing a sorting operation that sorts the plurality of columns of circulant matrices in a descending order of a first quality metric to generate a plurality of sorted columns of circulant matrices, the first quality metric indicative of a number of errors in a corresponding column of circulant matrices; and
iteratively processing the plurality of sorted columns of circulant matrices to determine a candidate version of the transmitted codeword,
wherein, for each column of the plurality of sorted columns of circulant matrices, iteratively processing the plurality of sorted columns comprises:
determining a second quality metric indicative of the number of errors in the column,
comparing the second quality metric to at least one threshold, and
in response to the comparing, selectively processing the column in an order determined by the sorting operation,
wherein processing the column comprises performing a message passing algorithm between a plurality of variable nodes and a plurality of check nodes that represent the parity matrix of the LDPC code to determine the candidate version of the transmitted codeword.

* * * * *